United States Patent
Lindfors et al.

(10) Patent No.: US 7,060,132 B2
(45) Date of Patent: Jun. 13, 2006

(54) METHOD AND APPARATUS OF GROWING A THIN FILM

(75) Inventors: Sven Lindfors, Espoo (FI); Ivo Raaijmakers, Bilthoven (NL)

(73) Assignee: ASM International N.V., Bilthoven (NL)

(*) Notice: Subject to any disclaimer, the term of this patent is extended or adjusted under 35 U.S.C. 154(b) by 89 days.

(21) Appl. No.: 10/270,745

(22) Filed: Oct. 11, 2002

(65) Prior Publication Data

US 2003/0121469 A1 Jul. 3, 2003

Related U.S. Application Data

(63) Continuation-in-part of application No. 09/836,674, filed on Apr. 16, 2001.

(30) Foreign Application Priority Data

Apr. 14, 2000 (FI) .................................. 20000899
Oct. 12, 2001 (FI) .................................. 20011998

(51) Int. Cl.
*C30B 23/00* (2006.01)

(52) U.S. Cl. .............................. 117/93; 117/84; 117/88; 117/89; 117/102; 117/105

(58) Field of Classification Search ................... 117/84, 117/88, 89, 93, 102, 105
See application file for complete search history.

(56) References Cited

U.S. PATENT DOCUMENTS

| | | |
|---|---|---|
| 4,058,430 A | 11/1977 | Suntola et al. |
| 4,389,973 A | 6/1983 | Suntola et al. |
| 4,413,022 A | 11/1983 | Suntola et al. |
| 4,780,817 A | 10/1988 | Lofgren et al. |
| 4,840,921 A | 6/1989 | Matsumoto |
| 4,940,213 A | 7/1990 | Ohmine et al. |
| 5,102,637 A | 4/1992 | Snyder et al. |
| 5,114,683 A | 5/1992 | Hirase |
| 5,166,092 A | 11/1992 | Mochizuki et al. |
| 5,300,186 A | 4/1994 | Kitahara et al. |
| 5,316,793 A | 5/1994 | Wallace et al. |

(Continued)

FOREIGN PATENT DOCUMENTS

EP 0 823 279 A2 2/1998

(Continued)

OTHER PUBLICATIONS

Handbook of Crystal Growth 3, Thin Films and epitaxy, Part B. Growth Mechanisms and Dynamics, p. 625.

(Continued)

*Primary Examiner*—Robert Kunemund
*Assistant Examiner*—Matthew J. Song
(74) *Attorney, Agent, or Firm*—Knobbe, Martens, Olson, & Bear LLP

(57) ABSTRACT

A method and apparatus for growing a thin film onto a substrate is disclosed. According to one embodiment, a plurality of substrates, each having a width and a length, are placed in a reaction space and the substrates are subjected to surface reactions of vapor-phase reactants according to the ALD method to form a thin film on the surfaces of the substrates. The reaction space comprises an elongated gas channel having a cross-section with a width greater that the height and which has a length which is at least 2 times greater than the length of one substrate in the direction of the gas flow in the channel, the channel having a folded configuration with at least one approximately 180 degree turn in the direction of the gas flow.

19 Claims, 10 Drawing Sheets

U.S. PATENT DOCUMENTS

| | | |
|---|---|---|
| 5,417,934 A | 5/1995 | Smith et al. |
| 5,601,651 A | 2/1997 | Watabe |
| 5,688,479 A | 11/1997 | Chao |
| 5,819,683 A | 10/1998 | Ikeda et al. |
| 5,855,675 A | 1/1999 | Doering et al. |
| 5,855,680 A * | 1/1999 | Soininen et al. ............ 118/719 |
| 5,879,459 A * | 3/1999 | Gadgil et al. ............... 118/715 |
| 5,916,365 A * | 6/1999 | Sherman ...................... 117/92 |
| 5,928,426 A | 7/1999 | Aitchison et al. |
| 6,015,590 A * | 1/2000 | Suntola et al. ......... 427/255.23 |
| 6,063,197 A | 5/2000 | Cox et al. |
| 6,093,253 A | 7/2000 | Lofgren et al. |
| 6,099,649 A | 8/2000 | Schmitt et al. |
| 6,193,802 B1 | 2/2001 | Pang et al. |
| 6,197,119 B1 | 3/2001 | Dozoretz et al. |
| 6,200,893 B1 | 3/2001 | Sneh |
| 6,223,684 B1 | 5/2001 | Fujioka et al. |
| 6,238,514 B1 | 5/2001 | Gu |
| 6,305,314 B1 | 10/2001 | Sneh et al. |
| 6,306,216 B1 | 10/2001 | Kim et al. |
| 6,506,352 B1 | 1/2003 | Lindfors et al. |
| 6,770,145 B1 | 8/2004 | Saito |
| 2001/0000866 A1 | 5/2001 | Sneh et al. |

FOREIGN PATENT DOCUMENTS

| | | |
|---|---|---|
| FI | 84980 | 11/1991 |
| WO | WO 99/23686 | 5/1999 |
| WO | WO 9951797 A1 | 10/1999 |

OTHER PUBLICATIONS

M. Leskela et al., "Synthesis of oxide thin films and overlayers by atomic layer epitaxy for advanced applications," Materials Science & Engineering, vol. B41 (1996), pp. 23-29.

Niinsito et al., "ALD precursor chemistry: evolution and future challenges," Journal de Physique IV. vol. 9 (1999), pp. Pr8-837-Pr-852.

Tuomo Suntola, "Atomic layer epitaxy," Thin Solid Films, vol. 216 (1992), pp. 84-89.

* cited by examiner

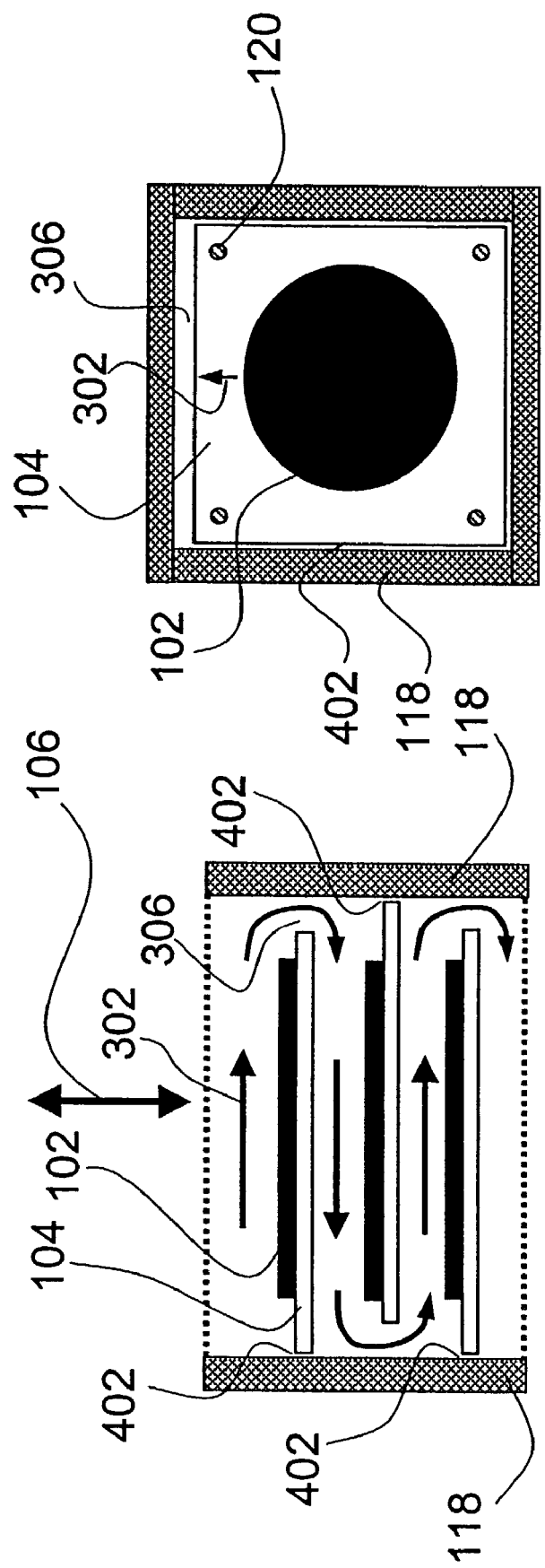

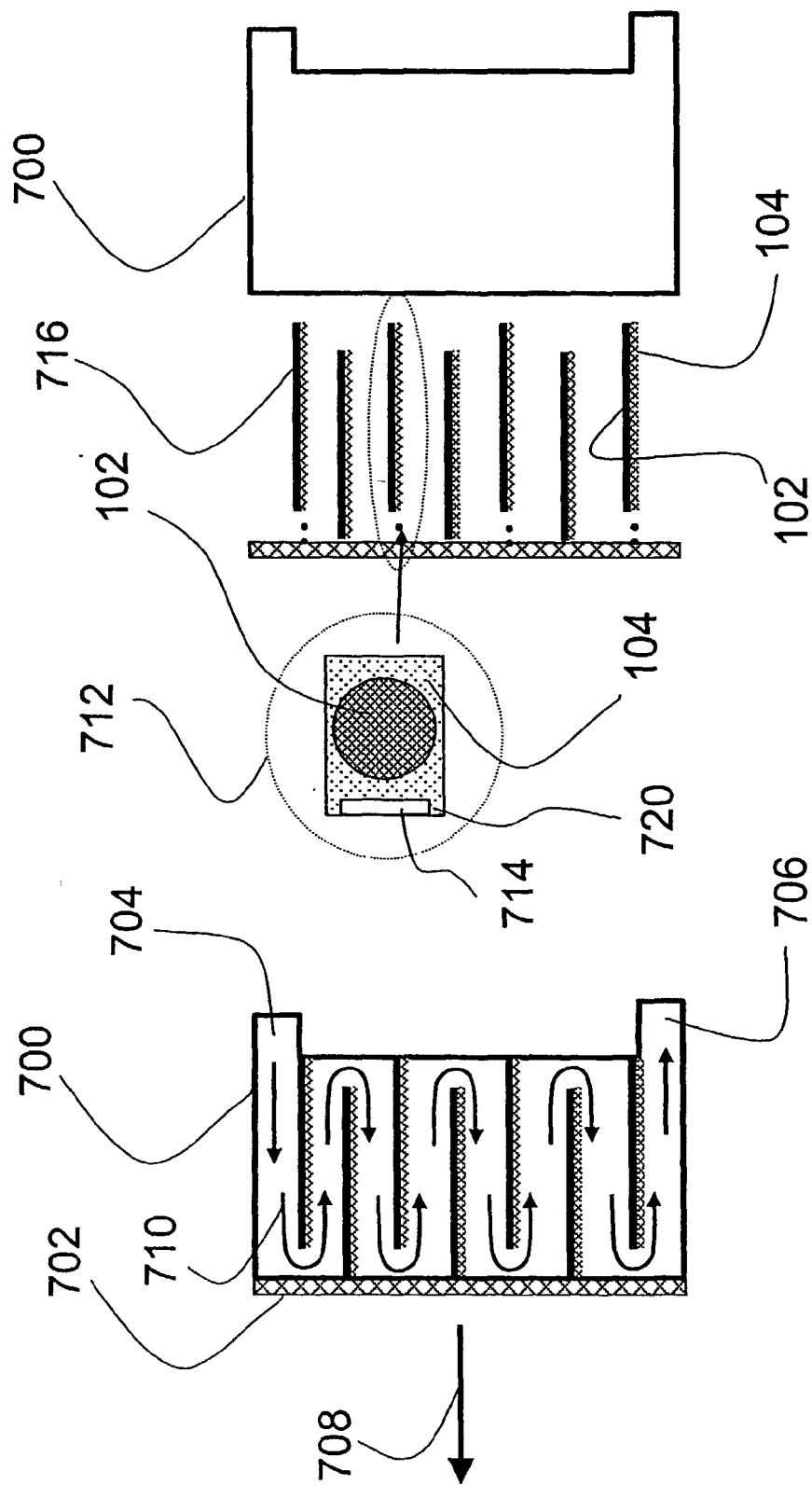

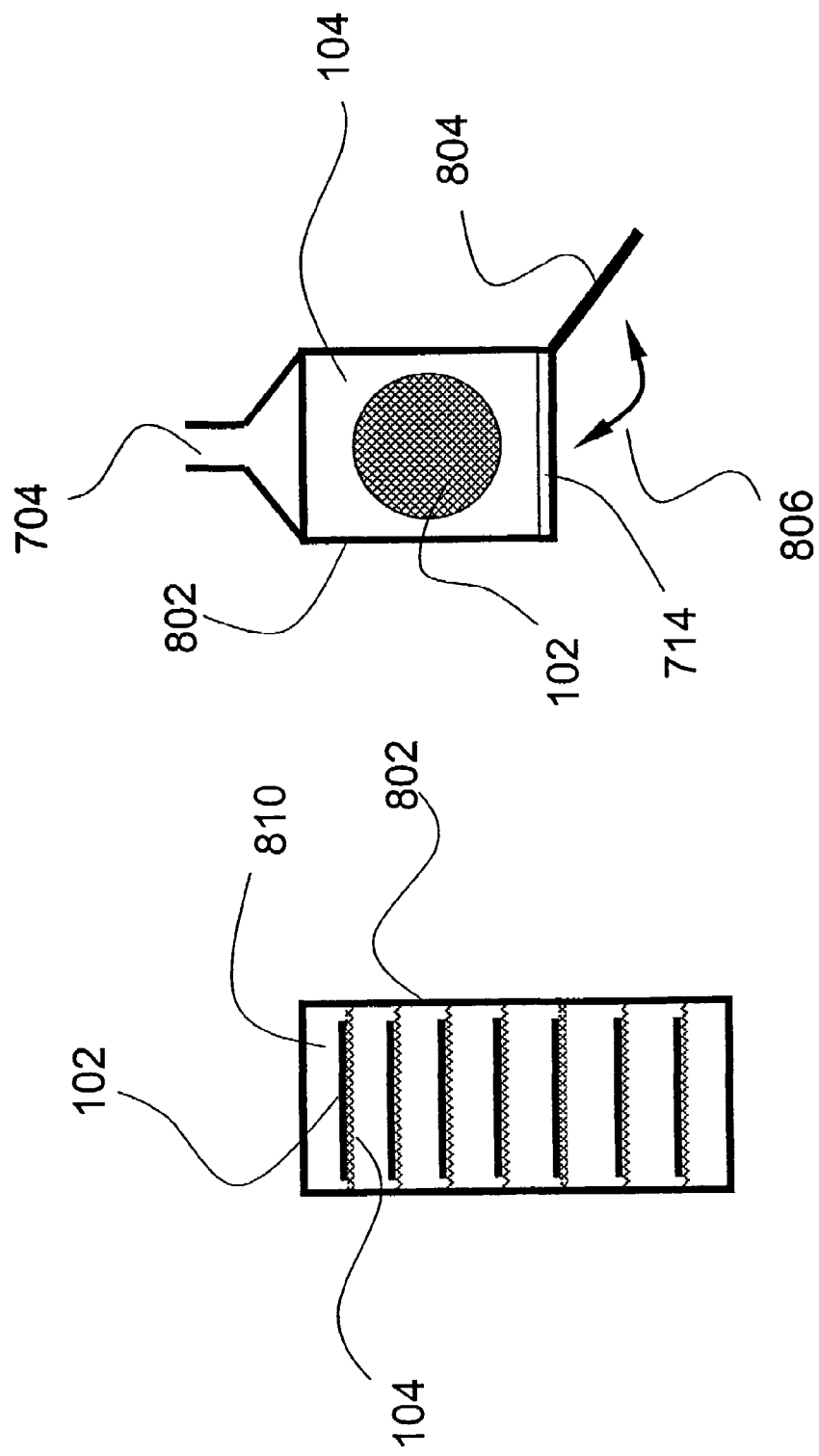

METHOD AND APPARATUS OF GROWING A THIN FILM

PRIORITY INFORMATION

This application is a continuation-in-part of U.S. patent application Ser. No. 09/836,674, filed Apr. 16, 2001, which claims the priority under 35 U.S.C. §119 of Finnish Patent Application No. 20000899, filed Apr. 14, 2000, and this application claims the priority under 35 U.S.C. §119 of Finnish Patent Application No. 20011998, filed Oct. 12, 2001, the disclosures of these applications are hereby incorporated herein by reference in their entirety.

BACKGROUND OF THE INVENTION

1. Field of the Invention

The present invention relates to the production of thin films and, in particular, to methods and apparatus for producing a thin film on a substrate by subjecting the substrate to repeated pulses of gas or vapor-phase reactants.

2. Description of the Related Art

Atomic Layer Deposition (abbreviated "ALD"), which was formerly called Atomic Layer Epitaxy or "ALE," is a method in which thin films are grown on the surface of a substrate by subjecting it to alternate surface reactions of vaporized reactants. As known in the art, in conventional MBE and CVD processes, the growth rate of thin films is primarily adjusted by controlling the inflow rates of starting materials impinging on the substrate and the substrate temperature. By contrast, the thin film growth rate in the ALD process is controlled by the substrate surface properties, rather than by the concentrations or other qualities of the starting material inflows. In the ALD process, the only prerequisite is that the starting material is provided in a sufficient concentration for film growth on the substrate.

The ALD method is described, e.g., in FI Patents Nos. 52,359 and 57,975 as well as in U.S. Pat. Nos. 4,058,430 and 4,389,973. Apparatuses for implementing the ALD method are also disclosed in U.S. Pat. Nos. 5,711,811, 5,855,680 and 6,015,590.

In the ALD method, atoms or molecules sweep over the substrates thus continuously impinging on their surface so that a fully saturated molecular layer is formed thereon by a single pulse in a self-limited manner. A separate pulse reacts with the monolayer, and the cycle repeats. Each cycle can include tow or more pulses of different reactants, each separated in time and space by removal steps (e.g., purging). Thus, typically, an ALD method comprises the steps of feeding vapor-phase reactants into a reaction chamber in the form of vapor-phase pulses repeatedly and alternately, causing the vapor-phase reactants to react with the surface of the substrate to form a thin film compound on the substrate.

Equipment for the ALD method and processes utilizing the ALD method are commercially available under the trade name of ALCVD™ by ASM Microchemistry Oy, Espoo, Finland.

ALD processing is usually carried out as a batch process. There are some apparatuses suggested for simultaneous processing of a plurality of substrates. Thus, one approach is presented in U.S. Pat. No. 5,879,459. The system of the reference consists of single wafer Low Profile Compact atomic layer Deposition Reactor (LP-CAR) compartments that are arranged in a vertical stack. Every LP-CAR contains a gate valve for the wafers to be transferred in and out from the process chambers with the cluster tool provided. The LP-CAR's must also provide equal process conditions for each wafer, and a significant number of heaters, gate valves, gas supplies and vacuum lines are required for batch processing.

Another set-up is presented in U.S. Pat. No. 6,042,652. There is a plurality of stages for holding substrates inside semi-open substrate compartments. The substrate trays are arranged so that reactants and inert gas flow over the parallel substrates. The reactant supply is balanced between substrate compartments by flow distributors that restrict the gas flow in a controllable way.

One reactor set-up that changes the flow direction of gases is presented in published PCT patent application WO 00/79576. The gas feeds and the exhaust are arranged on top of a single substrate reactor.

There are a number of disadvantages and problems related to the cited known art. A fundamental problem of conventional batch systems is their dependence on radiative heat transfer due to the poor conduction through the gas at lower pressures typically employed in ALD. At low pressures, the heat transfer from the heated surfaces to the substrates by conduction through the low-pressure gas and by the convection of the low-pressure gas is poor. The amount of heat energy transferred mainly by infrared radiation is based on the temperature difference between the emitting surface and the absorbing surface.

Furthermore, the reactor presented in U.S. Pat. No. 5,879,459 is expensive for batch processing of substrates because of the complex structure and the large number of costly parts. A problem particularly related to the apparatus of U.S. Pat. No. 6,042,652 is that stringent requirements must be placed on the tightness of the flow distributors to ensure that the distribution of gases is even for each substrate compartment.

In addition, the reactor presented in published PCT patent application WO 00/79576 can be used only for processing single substrates and the design with a plasma electrode is not meant for batch processing.

Therefore, based on the art cited above there is a need for an improved method and apparatus for ALD batch processing, which improves heat transfer, which reduces heat-up times and which increases the capacity of the equipment. There is also a need of simplified batch processing equipment.

SUMMARY OF THE INVENTION

One object of the present invention is to provide a novel method of simultaneous batch processing of a plurality of substrates by the ALD process. Another object of the present invention is to provide a novel apparatus for implementing such a process. These and other objectives, together with the advantages thereof over known processes and apparatuses, which shall become apparent from the following specification, are accomplished by the invention as claimed below and hereinafter described by reference to certain preferred embodiments.

In one embodiment of the present invention, the ALD growth is carried out in a single gas flow channel having a height, a width and a length, forming the dominant flow restrictor for the gas flow through the reaction space. The width of the channel is substantially larger than the height of the channel and the length of the channel is substantially larger than the width of the channel. In one embodiment, the length of the channel is at least twice the diameter of the (circular) substrate or, in the case of quadratic or rectangular substrates, at least twice the length of the substrate in the direction of the gas flow.

In yet another embodiment of the present invention, in order to minimize the footprint of the deposition reactor, the gas flow channel through the reaction chamber is folded at least once so that there is at least one approximately 180° turn in the flow channel.

One aspect of the present invention is an apparatus for growing thin films onto a plurality of substrates by subjecting the substrates to alternately repeated surface reactions of vapor-phase reactants according to the ALD method. The apparatus comprises a reaction space into which the plurality of substrates can be disposed. The apparatus also comprises a plurality of inflow channels that communicate with the reaction space. The inflow channels are suited for feeding the vapor-phase reactants in the form of vapor-phase pulses into the reaction space. At least one outflow channel communicates with the reaction space. The outflow channel is suited for receiving outflow of reaction products and excess amounts of reactants from the reaction space. The reaction space comprises an elongated gas channel that has a folded configuration with at least one approximately 180 degree turn in a direction of gas flow through the elongated channel.

Another aspect of the present invention is a method for growing a thin film on a plurality of substrates, which each have a width and a length, in a reaction space according to the ALD method. The method comprises repeatedly and alternately feeding vapor-phase reactants into the reaction space in a form of vapor-phase pulses to form a gas flow in the reaction space, turning the gas flow at least once approximately 180 degrees in the direction of the gas flow; and causing the vapor-phase reactants to react with the surfaces of the substrates to form a thin film compound on the substrates.

The embodiments summarized above have several advantages. For example, in cases where it takes a long time for depositing a thin film on the wafer, it is advantageous to increase the throughput of the ALD process with batch type processing. In order to increase the robustness of the reactor it is an advantage to simplify the requirements for reaction space tolerances. Source chemicals flow through a long, folded, single reaction space path and the the chemicals cannot choose between competitive parallel flow paths through the reaction space. The deposition processes done in a folded single channel reaction space structure are less sensitive to source chemical pulse and inert gas purge times than the deposition processes done in a parallel reaction space. The folded reaction space is less sensitive to the changes of the local flow channel dimensions when the temperature changes. Mechanical stress may bend metal plates especially when the reaction space is heated for the first time after mechanical cleaning of the reaction chamber parts, e.g., by glass bead blowing. Moreover, it is a benefit that no sealing surfaces are rubbed against each other, and thus the generation of particles is suppressed.

A multiple heated susceptor-based batch system also has a distinct advantage in reduced heat-up time. In addition susceptors prevent unwanted backside deposition.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

BRIEF DESCRIPTION OF THE DRAWINGS

FIG. 4a shows a schematic partial side view of the folded reaction space reactor, in accordance with another embodiment.

FIG. 4b shows a schematic top view of one substrate plate of the folded reaction space reactor of FIG. 4a.

FIG. 7a shows a schematic side view of a folded reaction space reactor with a movable door in its deposition position, in accordance with another embodiment.

FIG. 7b shows a schematic side view of a folded reaction space reactor with a movable door in its unloading position in accordance with one arrangement of the embodiment of FIG. 7a.

FIG. 7c shows a schematic side view of a folded reaction space reactor with a movable door in its unloading position, in accordance with a second arrangement of FIG. 7a.

FIG. 7d shows a schematic side view of a folded reaction space reactor with a movable door in its unloading position, in accordance with a third arrangement of FIG. 7a.

FIG. 8a shows a schematic front view of a folded reaction space reactor with susceptors, in accordance with another embodiment.

FIG. 8b shows a schematic top view of the folded reaction space reactor of FIG. 8a with an opened front door.

DETAILED DESCRIPTION OF THE PREFERRED EMBODIMENT

Figure 1:
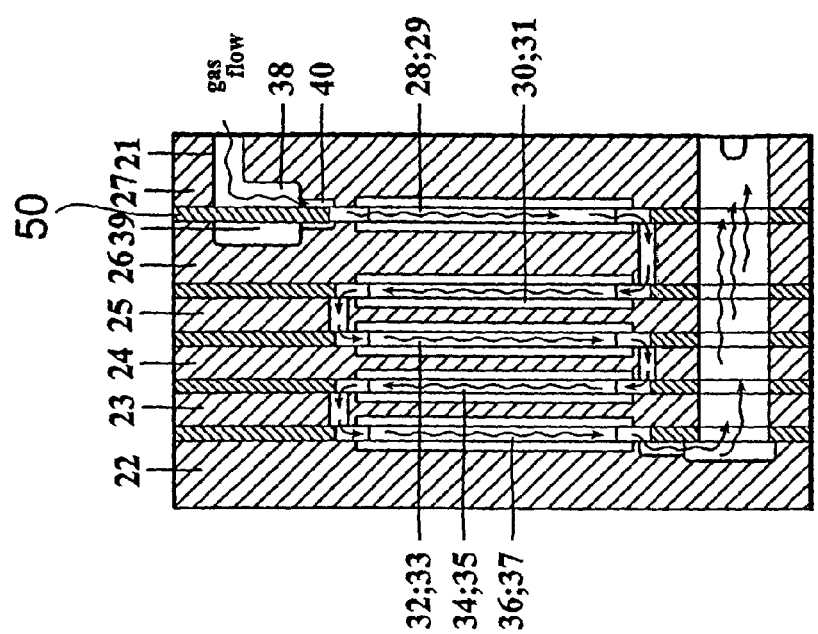
FIG. 1 shows a schematic side view of a folded reaction space reactor assembled from plates, in accordance with one embodiment of the present invention.

One embodiment of the present invention involves a method of growing a thin film onto a substrate, in which method a plurality of substrates are placed in serial alignment in a reaction chamber formed by an elongated reaction channel and each actual substrate is subjected to surface reactions of a plurality of vapor-phase reactants according to the ALD method to form a thin film.

A typical pulsing sequence used for ALD growth of thin film consists of four basic steps:
1. first source chemical pulse
2. first purging period
3. second source chemical pulse
4. second purging period These four steps are repeated until a thin film of predetermined thickness is obtained. The purging periods may comprise of inert gas purging optionally combined with or replaced with a vacuum pump down of the reaction space. An advanced pulsing sequence may comprise, e.g., three different source chemical pulses that are separated from each other with reactor removal periods. According to one embodiment of the present invention, the source chemical molecules leave the reactor before introducing the following source chemical molecules to the reaction space channel. According to another embodiment, there may be more than one source chemical volume flowing along the folded reaction space channel at the same time. However, those source chemical volumes are separated from each other in the gas phase with inert gas volume that flows along the folded reaction chamber volume. In this embodiment it is necessary to improve the tightness of the susceptor or sealing plates against the reaction space wall (see, e.g., the embodiment shown in FIG. 7).

According to one embodiment of the present invention, the ALD serial batch processing reactor comprises a folded gas flow path arrangement with at least two serially aligned substrates. Serial placement of substrates is favorable for ALD processing because the dominating conductance of the flow system can be arranged across the substrates, providing an even gas blanket and repeatable pulsing conditions of the process gases in the reactor space conduit. Process conditions obtained with the folded gas flow path are comparable to those of single substrate processing. Repeatable pulsing and reaction conditions are obtained, because every pulse sequence will flow through the folded single gas flow path across the serially aligned substrates.

The expression "processing according to the ALD method" and similar expressions such as "conditions conducive to ALD growth" refer to conditions wherein the each vapor-phase reactant pulse is separately reacted with the surface of a substrate at a temperature in the range between the evaporation temperature of the reactant and the decomposition temperature of the condensation reactant at the prevailing pressure.

Herein, the term "substrate surface" is used to denote that top surface of the substrate on which the vapor-phase reactant flowing into the reaction chamber first impinges. In practice, the surface during the first cycle of the thin-film growing process usually comprises the surface of the substrate such as glass, silicon wafer or pre-existing layer(s) thereon; during the second cycle the surface is usually the layer comprising the solid-state reaction product which is deposited by the reaction between the sequential reactants and is adhered to the substrate, etc.

In the present context, the term "inactive" gas is used to refer to a gas, which is admitted into the reaction space and which is capable of preventing undesired reactions related to the reactants and the substrate, respectively. In one embodiment of the present invention, the inactive gas is also used advantageously as the carrier gas of the vapor-phase pulses of the reactants. Of inactive gases suited for use in the method, reference can be made to inert gases such as nitrogen gas and noble gases, e.g., argon. The inactive gas may also be an inherently reactive gas such as, hydrogen gas, serving to prevent undesirable reactions (e.g., oxidization reactions) from occurring on the substrate surface.

In the present context, the term "reactant" refers to a vaporizable material capable of reacting with the substrate surface. In the ALD method, reactants belonging in two different groups are conventionally employed. The reactants may be solids, liquids or gases under standard conditions. The term "metallic reactants" is used of metallic compounds, which may even be elemental metals. Suitable metallic reactants are the halogenides of metals including chlorides and bromides, for instance, and organometallic compounds such as the complex compounds. As examples of metallic reactants may be mentioned Zn, $ZnCl_2$, $TiCl_4$, $Ca(thd)_2$, $(CH_3)Al$ and $Cp_2Mg$. The term "nonmetallic reactants" is used for compounds and elements capable of reacting with metallic compounds. The latter group includes water, sulfur, hydrogen sulfide and ammonia. The term "precursor" is used synonymously with "reactant."

The "substrate" is any material on which the thin film is to be grown. Usually it comprises a planar sheet or plate of material, which is capable of withstanding the temperature of the reaction without deformation. The planar substrate can have any shape but usually it is rectangular or circular. A traditional application of ALD is for growing electroluminescent (EL) thin film display units on rectangular glass substrates. Recently, the versatility of ALD for growing thin films on circular silicon wafers has been demonstrated. Of course, the skilled artisan will appreciate that ALD can be applied for deposition on various other substrates, such as semiconductors.

The "reaction channel" is the space, also known as reaction chamber or reaction space, in which the gaseous reactants are contacted with the substrate. The reaction channel comprises the gas space preceding, preferably immediately preceding, the substrates up to the outlet end of the last substrate. In one arrangement, the reaction channel may comprise the gas space beginning at the first substrate. In another arrangement, the reaction channel may include the portion of the gas flow channel of the reactant in which the reactant contact with a substrate under conditions that eliminate any tail of residual reactant vapors as will be explained below.

A "substrate processing site" is also known as a "reaction chamber part", a "tray", a "susceptor" or a "susceptor plate". "Substrate processing site", as used herein, refers to a substrate supporting structure. The substrate processing sites in the illustrated arrangements are configured to hold a single substrate. That is, in the illustrated arrangements, the number of substrate processing sites equals the number of substrates. However, the substrate processing site can also be larger than the substrates so that more than one substrate can be placed on each substrate processing site.

In the preferred embodiment, the reaction channel comprises a space having a "flattened" cross-section in the flow direction of the reactants. In cross-section, the reaction channel may be rectangular exhibiting a width (orthogonal to the flow direction of the gas pulse front), which is greater than the height (also orthogonal to the flow) thereof. Preferably the width is approximately 1 to 200 times the channel height. More preferably, the width-to-height ratio is approximately 5:1 to 100:1 and still more preferably approximately 10:1 to 60:1. The reaction channel has a length, which is at least twice, preferably 2.1 to 50 times, and more preferably about 2.5 to 20 times, that of the diameter or length of one substrate which is to be processed.

Further, to allow for a compact construction, the reaction channel is preferably folded. That is, the reaction channel turns through at least one a corner or bend; the corner or bend turning through an angle between 150 degrees and 210 degrees, more preferably turning through an angle between 165 and 195 degrees, and most preferably approximately 180 degrees. To further reduce space, the angles of two successive corners combined preferably equal approximately 360 degrees such that the reaction spaces between bends are substantially parallel to each other. In one embodiment, the reaction channel has n−1 turns or bends, n being an integer standing for the number of substrate processing sites in the reaction channel. In another embodiment, the reaction channel has n or more turns or bends, n again being an integer standing for the number of substrate processing sites in the reaction channel.

It is preferred that the reaction channel has a width that exceeds the width of the substrate by at least 1%, preferably by at least 5%. More preferably, the width of the channel is at least 10% greater and most preferably 15% to 50% greater than the width of the substrate. Preferably, there is a free zone of about 10%–30% of the total width of the reaction channel on both sides of the substrate. The height of the channel can be constant or continuously increasing or decreasing along the flow path of the gas.

By selection of the channel width larger than the substrate width, it is possible to reduce disturbances of the flow caused by flow friction against the side walls of the reaction channel. Such friction may give rise to inhomogeneous growth of the thin films at the edges of the substrates.

The cross-section of the reaction channel can be constant over the whole length of the channel. The cross-section of reaction channel may also be continuously increasing or decreasing along the length of the channel. The first embodiment is useful for simplifying the manufacturing of the reactor and reaction channel components. In all embodiments, it is preferred to avoid the formation of convection cells in the gas flow by providing smooth reaction space walls.

According to one embodiment of the invention, which is particularly suited to reactions that have only moderate or slow speed, the residual components of the previous vapor-phase pulse are subjected in the reaction channel to a chemical reaction in order to convert the residues into a solid reaction product which does not interfere with the ALD growth of a thin film on the substrate placed in the rest of the reaction channel. In particular, this embodiment aims at producing a solid reaction product, which can be separately removed from the reactor equipment. Preferably, a part of the reactant molecules of the subsequent vapor-phase pulse are sacrificed and used for chemically depleting the residual concentration of the previous vapor-phase pulse. Thus, according to this embodiment a subsequent vapor-phase pulse is contacted with the residual components of the previous vapor-phase pulse so as to form a reaction product of the reactant of the subsequent vapor-phase pulse with the reactant of the previous vapor-phase pulse before feeding the subsequent vapor-phase pulse into the rest of the reaction channel.

Thus, for this embodiment, the apparatus comprises immediately upstream of the reaction chamber a pre-reaction zone, in which the residue of reactants of successive vapor-phase pulses can be reacted into solid material on the surfaces of the pre-reaction zone, so that the residual reactants are terminated before arriving to the part of the reaction channel where actual production substrates are placed. Thus, any possible CVD growth on the production substrates is avoided. The pre-reaction zone may partly operate in CVD growth conditions, although it is preferred that most of the film grows in ALD conditions also in the pre-reaction zone to avoid the formation of loose particles. The remaining parts of the reaction channel, which forms a second reaction zone and which typically contains at least two substrates, is operated under conditions conducive to ALD growth of a thin film. In addition to the actual substrate) on which the thin films are grown, a separate substrate can be arranged in the pre-reaction space to allow for deposition of a solid product formed by the reaction between the reactant pulses in the gas phase. This substrate, which is discarded, can be and preferably is of the same material as the actual substrate (s).

By virtue of the reaction, the residue of the preceding reactant will become chemically depleted and, thus, the residues are prevented from entering the reaction chamber simultaneously with the subsequent gas phase pulse.

The first reaction zone can be operated at any conditions which will give rise to the formation of a reaction product which can withdrawn separately from the actual thin film product. Preferably the pre-reaction zone is, however, operated at the same temperature as the second reaction zone, such that ALD reactions predominate in the pre-reaction zone.

According to a particularly preferred embodiment, the concentration of residual components of the previous vapor-phase pulse in the subsequent gas phase pulse is reduced to less than 1 ppm before the subsequent gas phase pulse is fed into the reaction chamber.

The present process can be combined with the process of U.S. Pat. No. 6,015,590, which is expressly incorporated by reference herein. Thus, by means of the prior process; the concentration of the residual components of the previous vapor-phase pulse is reduced by purging the reaction chamber and gas flow channels freely communicating with the reaction chamber. The purging step can be carried out by feeding inactive gas into the reaction chamber and into the gas flow channels while simultaneously pumping the reaction chamber with a vacuum pump. In this way, the concentration of the residual components of the previous vapor-phase pulse in the first reaction zone can be first reduced to less than 1 vol-% before contacting the residual components with the subsequent vapor-phase pulse and depleting the residual components while they are in the prereaction zone.

An example of a medium speed reaction of the above kind is the reaction between titanium tetrachloride and ammonia, which gives rise to titanium nitride. High speed reactions, such as the reaction of TMA (trimethyl aluminum) with water to grow aluminum oxide, will take place so rapidly that a separate prereaction space may be superfluous.

The pressure in the reaction channel and in the gas flow channels freely communicating with the reaction chamber is typically in the range of 1 to 100 mbar.

As will have become apparent from the above discussion, the preferred embodiment of the invention is based on serial arrangement of a plurality of substrates in a reaction channel having a flattened cross-section and a folded conformation. The benefits of the serial arrangement of the substrates will be readily apparent. A short description about the gas flow conductivities follows. Reference is also made to the attached drawings which will, however, be discussed in more detail further below.

The flow conductivity of two parallel flow channels $C_1$ and $C_2$ can be calculated according to equation 1.

$$C = C_1 + C_2 \qquad \text{Eq. 1}$$

The flow conductivity of two serial flow channels $C_1$ and $C_2$ can be calculated according to equation 2.

$$1/C = 1/C_1 + 1/C_2 \qquad \text{Eq. 2}$$

Gas flow conductivity in a rectangular channel is expressed in equation 3

$$C = 4.6 b^3 a / l ((P_1 + P_2)/2) \qquad \text{Eq. 3}$$

In eq. 3, b is the height of the channel, a is the width of the channel, l is the length of the channel and $(P_1+P_2)/2$ is the average pressure in the channel. Eq. 3 assumes that the width of the channel is substantially larger than the height of the channel. The height of the flow channel clearly affects the conductivity. For example, if the height of the channel increases by 10%, eq. 3 shows that the conductivity increases by about 33%. In batch stacks the distance between the substrates, i.e., the channel height, can be in the order of 5 mm and the distance may clearly vary from one channel to another. In order to saturate all substrate surfaces it is necessary to supply enough reactant molecules to every channel.

If there is one channel with a smaller height than that of the other channels, that deviating channel receives fewer source molecules per time unit than those other channels and it is necessary to either increase the concentration of the reactant pulse or lengthen the reactant pulse. In both cases there will be increased loss of reactant to the exhaust. In addition, purging time must be increased to purge all substrate channels.

If there is one channel with a larger height than that of the other channels, then the more spacious channel receives more source molecules per time unit than those other channels and it acts as a preferred flow channel for the gases and it drains the source pulse. In this case also, more source chemicals are needed.

According to one embodiment of the present invention substrates are arranged along a folded single gas flow channel that is a major part of the reaction space. In a minimum configuration there are two substrates, one for collecting the residue of the reactant pulses and one substrate for growing a thin film in ALD mode. The flow direction of reactant and purging gases is turned by approximately 180 degrees between the substrates as shown in FIGS. 3a, 4a, 5a, 6 and 7a.

There are various ways of implementing the principle of folded reaction space. According to one embodiment of the present invention substrates with susceptors can be loaded and unloaded vertically (FIGS. 2, 3a, 4a, 5a and 6).

Figures 7C, 7D:
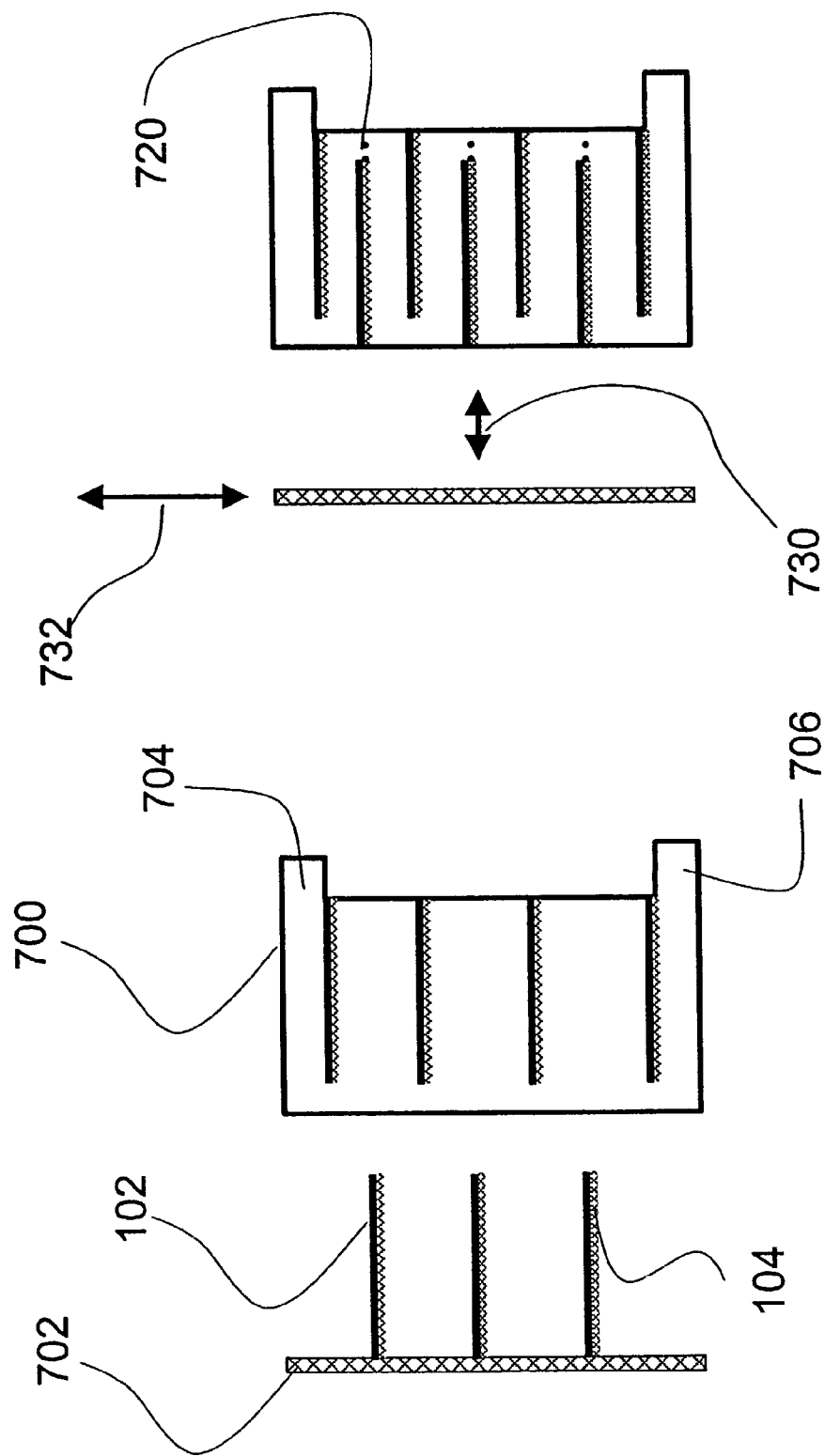

According to another embodiment of the present invention there is a movable vertical wall that forms a side wall of the reaction chamber box (FIGS. 7–8). Loading and unloading of the substrates can be done in a horizontal direction. The vertical wall can be without susceptors (FIG. 7d), contain some susceptors (FIG. 7c) or it may contain all of the susceptors (FIG. 7b).

Figures 9A, 9B, 9C:
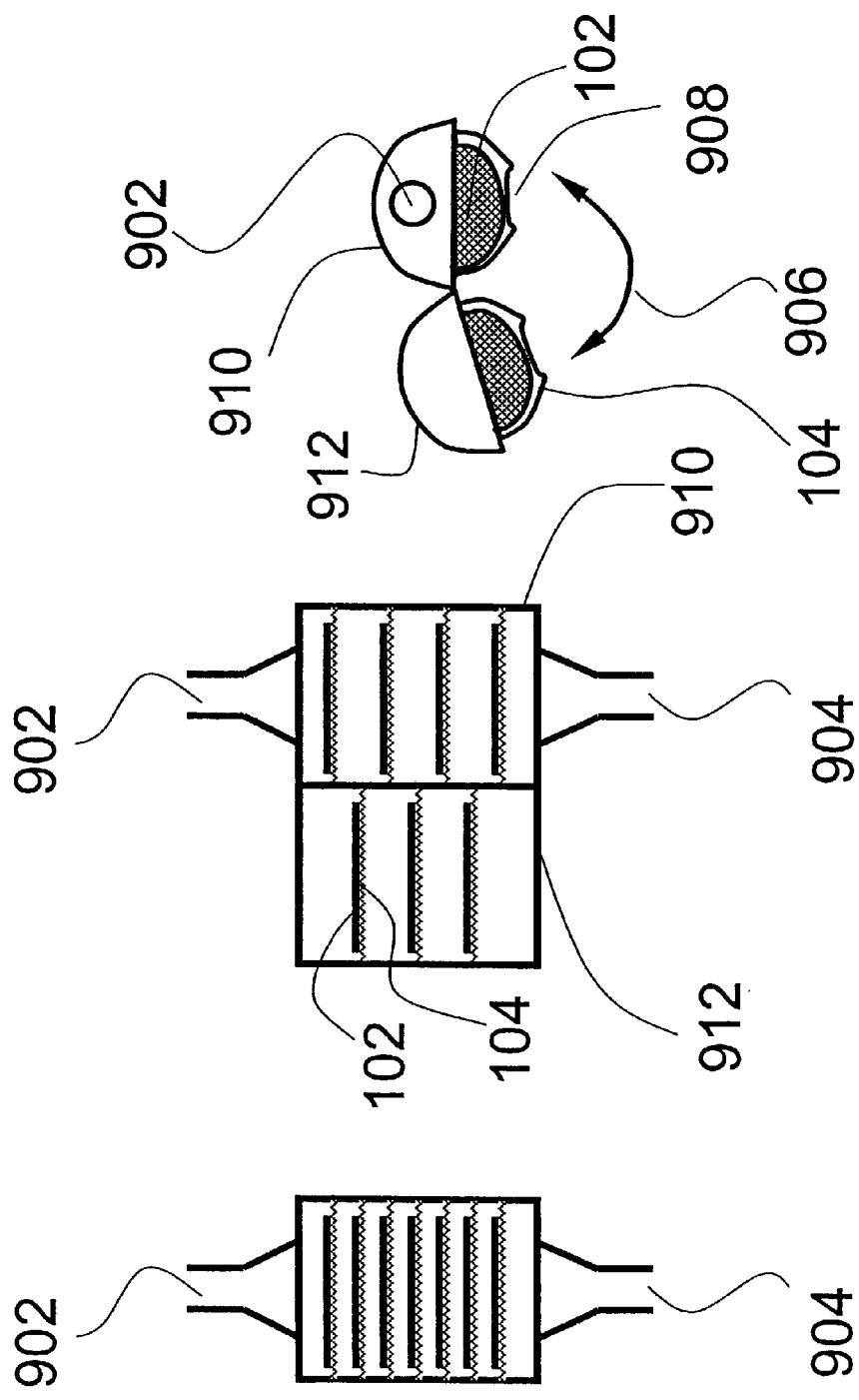
FIG. 9a shows a schematic front view of a folded reaction space reactor with substrate trays inside a closed cylinder, in accordance with another embodiment.
FIG. 9b shows a schematic front view of the folded reaction space reactor of FIG. 9a with substrate trays inside opened cylinder halves.
FIG. 9c shows a schematic top view of the folded reaction space reactor of FIG. 9a showing the top most susceptors inside the opened cylinder halves.

According to still another embodiment of the present invention the reaction space is divided into two halves (FIGS. 9a–9c). Both halves can be moved or there is one immobile half and the other half is movable in respect to the immobile half. One half is rotated horizontally until the halves meet each other and a folded reaction space is formed.

The flow path through the folded reaction space can be very long, up to tens of meters. In embodiments with a good seal between the substrate compartments it is possible to apply the multiple reactant pulse principle. There could be thus at least two reactant pulses flowing along the flow path so that the pulses are spatially separated from each other with a moving inert gas zone, in accordance with the travelling wave principle.

According to one embodiment of the present invention there is a tolerance between the sealed surfaces so that the surfaces do not grind against each other, and on the other hand, the gap between the sealable surfaces is sufficiently small to prevent any considerable leak of gases through a short-cut route to the next substrate compartment.

The sealing can be arranged, e.g., with a pebble surface (i.e., a grained or textured surface without loose particles) so that the flow path for gases between the sealed surfaces becomes very long and it is essentially easier for the gases to flow along the serial flow path than between the sealing surfaces to the next compartment.

The folded reaction space reactor can be operated according to the purging principle, the evacuation principle, the travelling wave principle or the pulsed pumpdown principle. According to the purging principle the reaction space is purged with inert gas between the reactant pulses so that reactants cannot react with each other in the gas phase of the reaction chamber. There is only one reactant pulse at a time flowing through the folded reaction space.

According to the evacuation principle the reaction space is evacuated of surplus reactant and reaction by-products between the reactant pulses. The residues of the previous reactant pulse are evacuated essentially completely before introducing the next reactant pulse into the folded reaction space. Purge gas can be simultaneously supplied to aid removal of the reactants.

According to the traveling wave principle there can be two or more reactant pulses traveling through the folded reaction space so that the reactant pulses are separated from each other with moving inert gas volumes.

According to the pulsed pumpdown principle, an inert gas pulse is introduced into the folded reaction space at least once during a pumpdown period. Pumpdown decreases the pressure of the folded reaction space and the inert gas pulse increases the pressure of the folded reaction space. The pumpdown period separates the source chemical pulses from each other.

The substrates in the stack can be in horizontal or even in vertical position when the substrates are attached to susceptors. Advantageously, the reaction space is folded and the flow direction of gases is turned by approximately 180 degrees after passing each susceptor plate. Preferably, the exhaust is arranged after the last substrate plane so that it is not necessary to turn the gas flow direction after the last substrate plane or the flow direction is turned by only up to 90 degrees.

Turning now to the embodiment shown in FIG. 1, it can be noted that the apparatus according to the illustrated embodiment comprises a folded reaction space reactor assembled from plates. The reaction space comprises gas flow channels 21 formed in a reactor block formed of a plurality of reaction chamber parts or elements 22–27 which are stacked or rather fitted adjacent to each other. The reaction chamber parts can be manufactured from metal or quartz, as in the present case. The substrates 28–37 are placed in recesses formed between adjacent reactor parts. In each recess, there are two substrates facing each other, one on each side of a central opening. The substrate pair forms the surfaces with which the gas flow is contacted in the recess and on which a thin film is grown. In the illustrated embodiment, five pairs of substrates 28–37 are arranged in a serial arrangement to form a cascade. The reactant pulses are fed into the reaction space from two separate gas flow channels 38, 39. The gas flow of one of the reactants is shown by the arrows in FIG. 1.

There is a non-uniform area of thin film growth at the front side of the first pair of glass substrates 28, 29. When the reactants are fed from opposite sides, the purge of the gas channels 38, 39 and the spreading chamber 40 between the reactant pulses takes most of the excess material away, but there remains a tail of the preceding pulse. As a result, the conditions at the first pair of substrates are conducive to film growth by chemical vapor deposition since both reactants are available in the gas phase simultaneously. The reactants therefore react with each other in the gas phase and a solid product is deposited on the substrates, in particular at the front end of them. These substrates 28, 29 are discarded after the growth process reaction. Whereas the first pair of substrates take up the disturbed growth, the following substrates have uniform growth from the very front edge.

In the illustrated embodiment, at the entrance of the folded reaction space stack, there is a divider plate 50 that keeps the reactant vapor inlet channels 38, 39 separated from each other up to the spreading chamber 40.

Figure 2:
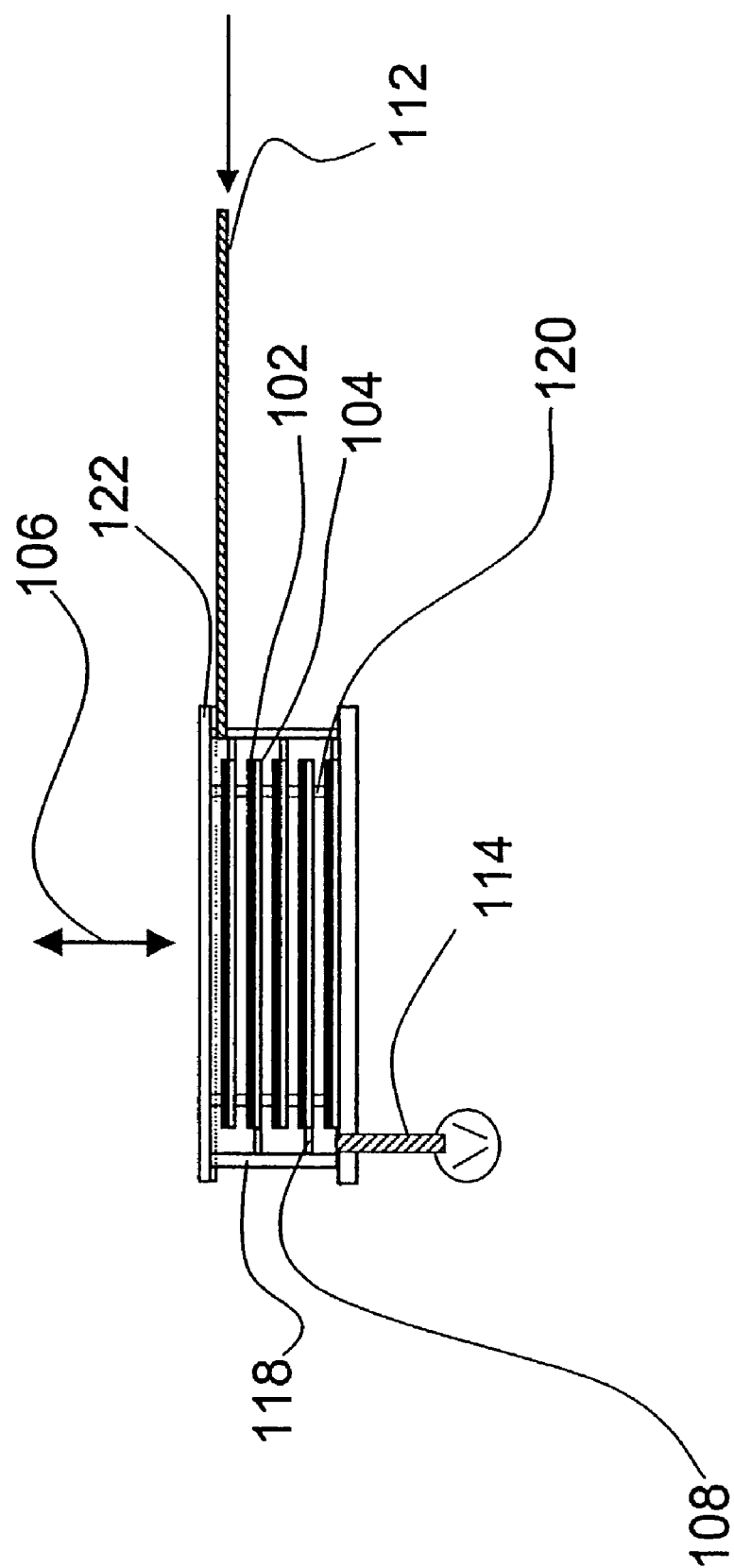
FIG. 2 shows a schematic side view of a folded reaction space reactor with substrates in deposition position, in accordance with another embodiment.
Figures 3A, 3B:
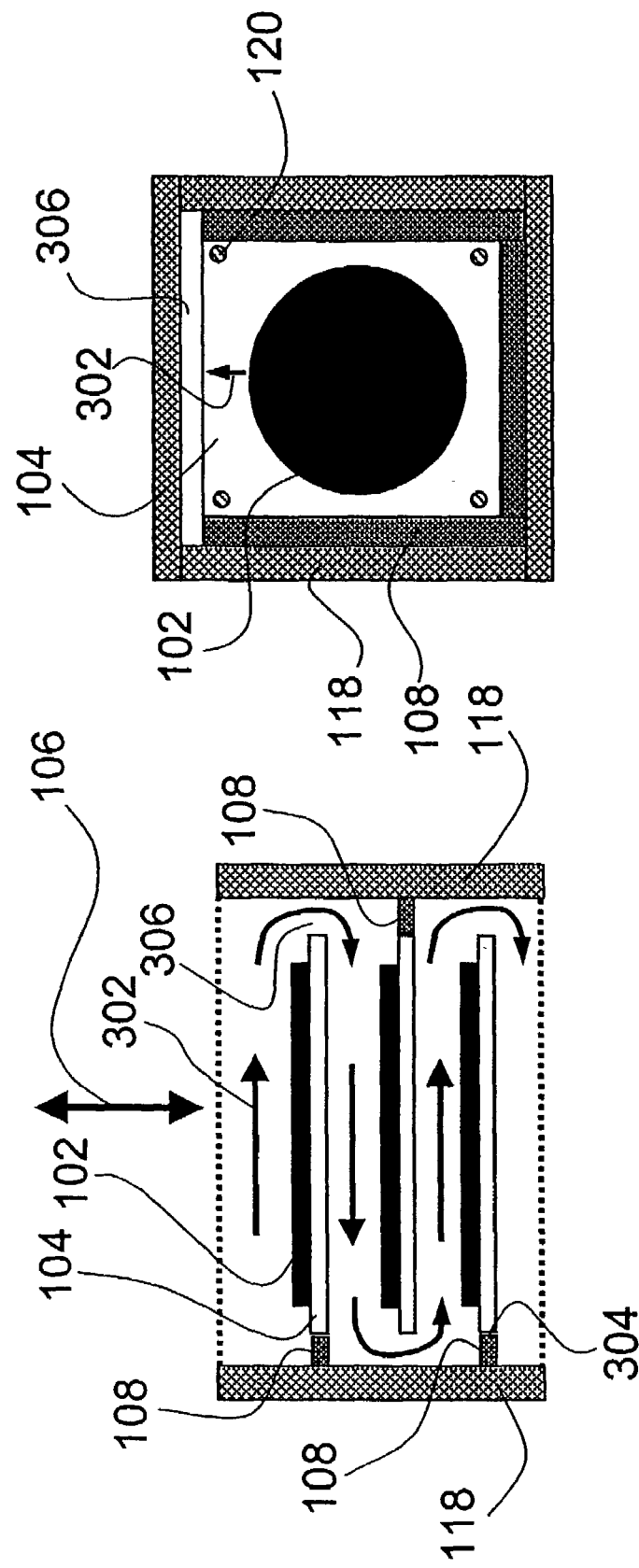
FIG. 3a shows a schematic side view of a part of the folded reaction space reactor of FIG. 2.
FIG. 3b shows a schematic top view of one substrate plate of the folded reaction space reactor of FIG. 2.

FIG. 2 shows a schematic side view of another embodiment of a folded reaction space reactor with substrates in deposition position. Substrates 102 are placed on trays 104. In the illustrated embodiment, supporting rods 120 keep the trays 104 in horizontal position and separate the trays 104 with a constant distance from each other. The supporting rods 120 are attached to a horizontal plate 122. The horizontal plate 122 forms the top wall of the reaction chamber box 118. The substrates 102 and the trays 104 can be moved in the vertical direction 106. The reaction chamber box 118 communicates with source chemical inlets 112 and an exhaust 114 connected to a vacuum pump. The reaction chamber box 118 can be placed inside a vacuum chamber. There are short horizontal plates 108 used for creating a folded reaction space when the substrates on susceptors have been lowered to the reaction chamber box 118. Source chemical vapor and inert purging gas are fed through the source chemical inlets 112 which are connected to the reaction chamber box 118. The narrow horizontal plates 108 force the gases to turn 180 degrees when the gases have crossed a substrate 102. In the illustrated embodiment, all the gases crossing the last substrate enter the exhaust tube 114 and go to the vacuum pump FIGS. 3a and 3b depict a part of the folded reaction space reactor. According to one embodiment of the present invention, there are narrow terraces 108 that are fastened to the side walls 118 of the reaction chamber box. There is a very narrow gap 304 between the terrace 108 and the susceptor 104. The gap 304 is sufficiently narrow to prevent any considerable gas leakage through the gap 304 to the subsequent substrate compartment. On the other hand, the gap 304 is sufficiently wide to prevent any rubbing between the terrace 108 and the susceptor 104 when the susceptor stack is loaded or unloaded in vertical direction. Particle formation is thus suppressed. Suitable width across the gap 304 is in the order of 0.1–1 mm, depending on the pressure in the reaction chamber box. Another gap 306 is part of the gas flow channel. In each substrate compartment a substrate 102 mostly forms the floor of the substrate compartment, an overlying susceptor 104 above the substrate floor forms the ceiling of the substrate compartment and the walls 118 of the reaction space box form the side walls of the substrate compartment. At one end of each substrate compartment there is a large gap 306 which forms a part of the gas flow channel. A suitable width of the gap 306 is comparable to the distance between a bottom substrate and a ceiling susceptor, i.e. the height of the substrate compartment. The width of the gap 306 can be, for example, in the order of 3–20 mm.

FIG. 3b shows the top view of one substrate plate of the folded reaction space reactor. The terrace 108 is located on three sides of each susceptor 104. The gases flow over the substrate until the gases arrive to the large gap 306 where the gas flow direction changes by 180°. Thus, the gas flow direction is substantially reversed in the subsequent substrate compartment compared to the flow direction in the previous substrate compartment. There are rods 120 fastened to the susceptor 104 keeping the susceptors in their correct positions with respect to the walls 118 of the reaction chamber box and in respect to each other.

FIGS. 4a–b illustrate another embodiment of the folded reaction space reactor having certain features and advantages according to the present invention. In this embodiment, the placement of the susceptors 104 form the folded reaction space with several substrate compartments. Separate terraces are not employed. There is a narrow gap 402 in the order of 0.1–1 mm between the side wall 118 of the reaction chamber box and the susceptor 104. On one side of the susceptor 104 there is a wider gap 306 which forms a part of the folded gas flow channel. Gaps 306 reverse the direction 302 of the gas flow so that there is a single long folded gas flow channel inside the reaction chamber box, flowing past multiple substrates 102, one after each turn.

Turning to FIG. 4b, which shows one substrate plate of the folded reaction space reactor, it can be noted that on three sides of the susceptor 104 there is a narrow gap 402 and on one side of the susceptor 104 there is a wider gap 306. Gases flow 302 over the substrate 102 and are folded by 180° in the large gap 306.

The folded reactor can be used for plasma enhanced ALD (PEALD) processes. In the illustrated arrangement of FIGS. 4a–b, the pulsed RF plasma can be formed between the susceptor plates 104 or in the gaps 306 between the susceptor plate 104 and the wall 118 of the reaction space box. The susceptor plate may be powered to do PEALD in batch mode. Preferably, the plasma is switched on after purging the metal source chemical. The plasma power is preferably off when there are metal source chemicals molecules in the gas phase of the reaction channel. Additional details about plasma CVD batch reactors can be found in U.S. Pat. Nos. 4,610,748 and 4,799,451, which are hereby incorporated by reference herein.

Figures 5A, 5B:
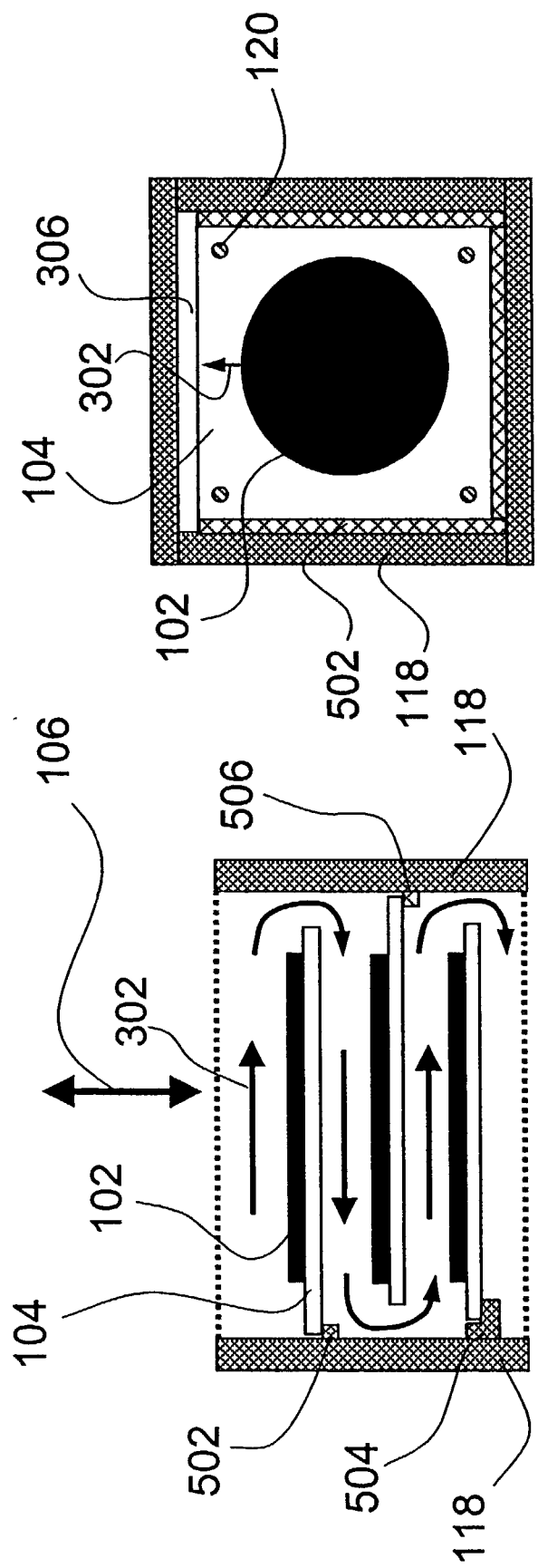
FIG. 5a shows a schematic partial side view of the folded reaction space reaction, in accordance with another embodiment.
FIG. 5b shows a schematic top view of one substrate plate of the folded reaction space reactor of FIG. 5a FIG. 6 shows a schematic partial side view of the folded reaction space reactor with tilted sidewalls, in accordance with another embodiment.

FIGS. 5a–b illustrate an embodiment wherein the susceptors 104 are lowered on supports 502, 504, 506 that form a sealing surface against the bottom surface of the susceptors 104. Supports 502, 504, 506 are fastened to the side walls 118 of the reaction chamber box. The arrangement is especially beneficial for running the reactor in multiple reactant pulse mode, shortened as "MRP mode" hereinafter. There are at least two reactant pulses flowing along the folded reaction space channel in MRP mode. The reactant pulses are separated from each other with a moving inert gas volume or inert gas "diffusion barrier."

For example, in FIG. 5a there are three susceptors 104 shown. In this case, the susceptors 104 can be referred to as upper, middle and lower susceptors. Two reactants X and Y are used for the deposition of the thin film on the substrates 102. According to the principles of Atomic Layer Deposition (ALD), the pulsing sequence comprises of four basic steps: X pulse/inert gas purge/Y pulse/inert gas purge. In this case MRP mode is carried out so that reactant X pulse is flowing over the substrate placed on the lower susceptor, while inert gas purge is flowing over the substrate placed over the middle susceptor, and while the reactant pulse Y is flowing over the substrate 102 placed on the upper susceptor 104. Each of the reactant pulses and the gas purge forms a gas volume that flows through the folded reaction space so that reactants are not mixed together in the gas phase of the folded reaction space. The pulsing sequence is repeated as many times as it is needed for growing a thin film of predetermined thickness. Thus, the thin film grows on the surfaces of the folded reaction space only via sequential self-saturated surface reactions.

The setup presented in FIG. 5a can be used for sequenced single reactant pulse ("SRP") method as well. According to SRP, there is only one reactant pulse in the folded reaction space at a time. When using SRP method, the surplus reactant molecules and possible reaction by-product molecules are essentially completely purged and/or pumped away from the folded reaction space before introducing the next reactant pulse to the folded reaction space. It can be seen that the lower support 504 is wider that the upper support 502. The dimensions of the susceptors and the supports 502, 504, 506 have been selected so that it is possible to raise the whole susceptor stack in the vertical direction 106 for loading and unloading of substrates 102 by means of the posts or bars 120 (FIG. 5b).

In the embodiment illustrated in FIG. 5b, the supports 502 surround the susceptor 104 on three sides. On the remaining side, there is a wide gap 306 which is a part of the folded gas flow channel. Gases flow 302 over the substrate 102 to the wide gap 306 and are folded by 180° before flowing over the following substrate which is placed in the next substrate compartment (not shown in FIG. 5b). Bars 120 keep the susceptor plates together with a predetermined distance between the susceptors.

Figure 6:
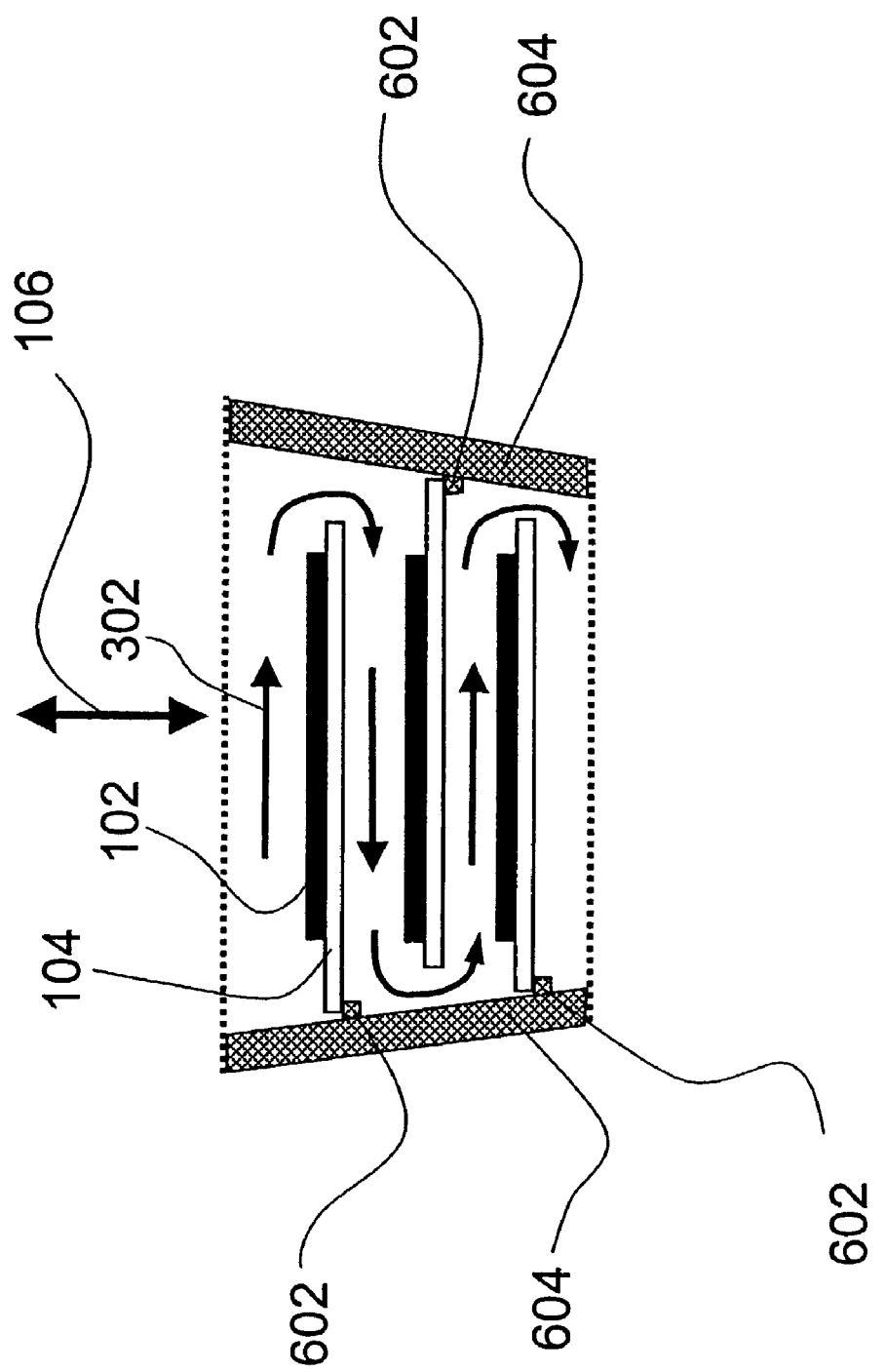

FIG. 6 shows in a schematic partial side view of another folded reaction space reactor. This embodiment includes tilted side walls 604. The walls of the reaction chamber box are inclined outwardly so that supports 602 with uniform width or diameter (as compared to FIG. 5a) can be used while still allowing the susceptor stack to be raised and lowered in vertical direction 106. It is also possible to incline the walls 604 inwardly so that the susceptor stack is pulled downwardly when it is time to unload the substrates. In that case the susceptors would be pushed against the supports when the susceptor stack is raised to the deposition position after loading of the substrates on the susceptors.

According to still another embodiment of the present invention, there are inclined walls, no supports and inclined susceptor sides so that three sides of the susceptors are in close contact or almost in contact with the inclined walls of the reaction chamber box when the susceptors are in the deposition position. In that case the exact placement of the susceptors in the vertical direction determines the tolerance between the three inclined sides of the susceptors and the inclined walls of the reaction chamber box. The remaining fourth side of each susceptor has a wide open gap, such as by a cut-out (see FIG. 7b) on one edge of the susceptor, that is a part of the folded reaction space channel.

FIGS. 7a–b illustrate another embodiment of the present invention. In this embodiment, the reactor includes a folded reaction space reactor with a movable door. The substrates are transported to and from the reaction chamber box in a horizontal direction 708. There is a door 702 that forms one wall of the reaction chamber box when the door 702 is pushed against the main body 700 of the reaction chamber box. During the thin film deposition process, reactant gases and inert purging gas are sequentially introduced to the gas inlet 704 of the reaction chamber box. Gases flow 710 over the substrates and the gas flow is folded by approximately 180° after each susceptor. Finally the gases exit the folded reaction space through an outlet 706.

FIG. 7b shows the folded reaction space reactor with a movable door in unloading position. According to one implementation all the susceptors 104 have been attached to the door 702. Every other susceptor has been attached to the door so that there is no gap between the susceptor 104 and the door 702, while the remaining susceptors 104 are attached to the door with necks 720 on sides with a wide gap 714 between the door 702 as shown inside a dotted circle 712, representing a top down view. A substrate 102 is placed on each susceptor. In some cases the uppermost substrate 716 can act as a sacrificial surface for adhering on the substrate a CVD growth component originating from the reactant flow tails. All the remaining substrates after the sacrificial substrate 716 are used for the ALD growth of thin films on them.

FIG. 7c shows another embodiment wherein every other susceptor 104 is attached to the door 702 so that there is no gap between the susceptors and the door. The remaining susceptors are attached to the back wall of the body 700 of the reaction space box so that there is no gap between the attached susceptors and the back wall. When assembled, gaps are left, as illustrated in FIG. 7a.

According to still another embodiment (FIG. 7d) all the susceptors are attached to the back wall of the body of the reaction chamber box. Every other susceptor is attached to the back wall so that there is no gap between the susceptor and the back wall. The rest of the susceptors are marked with two dots 720 and they are attached to the back wall, so that there is a large gap between the attachment necks, as illustrated in the dotted circle of FIG. 7b. When all the susceptors 104 are attached to the back wall, the loading and unloading of the substrates is simplified. When it is time to unload the substrates after the thin film deposition process, the door is first pulled in a horizontal direction 730 and then it is either raised in a vertical direction 732, lowered in a vertical direction (not shown) or slid sideways (not shown) so that all the substrates are easily accessible for unloading. Straight movements of the door suppress the particle formation because no surfaces are rubbed against each other.

FIGS. 8a–b illustrate another embodiment of a folded reaction space reactor with susceptors. In the embodiment, all of the susceptors 104 together with the substrates 102 are in the deposition position inside the reaction chamber box 810. A substrate compartment is a volume bordered by sidewalls 802, back wall (not shown), front door (not shown in FIG. 8a), the top surface of the substrate 102 and the bottom of an overlying susceptor 104. In every other substrate compartment the gases are flowing away from the viewer of FIG. 8a and in the remaining substrate compartments the gases are flowing towards the viewer of FIG. 8a.

FIG. 8b shows the folded reaction space reactor of FIG. 8a with an opened front door. The top-most substrate 102 is placed on a susceptor 104. The top-most susceptor 104 is so short that there is a wide gap 714 between the susceptor 104 and a door 804 when the door 804 is closed. In this implementation the door 804 is attached to the body 802 of the reaction chamber box with hinges (not shown) on one side and the door 804 resting on hinges is opened and closed in the direction of 806.

Another embodiment of a folded reaction space reactor with substrate trays inside a closed cylinder is shown in FIG. 9a. Reactant gases and purging gas enter the reaction space cylinder through an inlet 902 and exit the reaction space cylinder through an exit 904.

FIG. 9b is a schematic front view of a folded reaction space reactor with substrate trays 104 inside opened cylinder halves 910, 912. The substrates 102 are placed on susceptors 104 so that every other susceptor is attached to one cylinder half 910 and the rest of the susceptors 104 are attached to the other cylinder half 912. The cylinder halves 910, 912 can be attached together with hinges (not shown).

FIG. 9c shows the top most susceptors inside the opened cylinder halves 910, 912 of a folded reaction space reactor. The susceptors 104 each have a cut-out or an opening 908 on one side of the susceptors. The halves are connected together with hinges. When the half 912 is rotated on hinges along the direction 906 against the other half 910, a folded reaction space is formed. This kind of implementation with cylinder halves minimizes the susceptor area that is needed for holding substrate wafers. Note that the halves need not form a cylinder.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. Thus, it is intended that the scope of the present invention herein disclosed should not be limited by the particular disclosed embodiments described above, but should be determined only by a fair reading of the claims that follow.

We claim:

1. A method for growing a thin film on a plurality of substrates, which each have a width and a length, in a reaction space according to the ALD method, the method comprising:
   repeatedly and alternately feeding vapor phase reactants into the reaction space in a form of vapor phase pulses to form a gas flow in the reaction space;
   causing the vapor phase reactants to react with a surface of a first substrate that is separately removable from a reactor that defines the reaction space to form a thin film compound on the first substrate;
   turning the gas flow at least once approximately 180 degrees in the direction of the gas flow after causing the vapor phase reactants to react with the surface of the first substrate; and
   after turning the gas flow at least once approximately 180 degrees in the direction of the gas flow, causing the vapor phase reactants to react with a surface of a second substrate that is separately removable from the reactor that defines the reaction space to form a thin film compound on the second substrate.

2. The method according to claim 1, comprising passing the gas flow through the reaction space, which has a width, a height and a length, the width being greater than the height and the length of the reaction space being at least 2 times greater than the length of one of the substrates in the direction of the gas flow in the reaction space.

3. The method according to claim 1, wherein the reaction space has a length which is between 2.1 and 50 times greater than the length of one substrate.

4. The method according to claim 1, wherein the reaction space has a width, which is at least 10% greater than the width of the substrates.

5. The method according to claim 4, wherein the width of the reaction space is 15 to 50% greater than the width of the substrates.

6. The method according to claim 1, comprising turning the gas flow approximately 180 degrees n−1 times, wherein n is an integer signifying the number of substrate processing sites in the reaction space.

7. The method according to claim 1, comprising turning the gas flow approximately 180 degrees n times, wherein n is an integer signifying the number of substrate processing sites in the reaction space.

8. The method according to claim 1, comprising reacting a subsequent vapor phase pulse with residual components of a previous vapor phase pulse at an inlet end of said reaction space.

9. The method according to claim 8, comprising depositing products of reacting said subsequent vapor-phase pulse with the residuals components of a previous vapor-phase pulse on a surface of a sacrificial substrate.

10. The method according to claim 9, comprising removing said sacrificial substrate from said reaction space.

11. The method according to claim 9, wherein the step of reacting a subsequent vapor-phase pulse with residual components is partly done under chemical vapor deposition conditions.

12. The method according to claim 9, wherein the step of reacting a subsequent vapor-phase pulse with residual components is done under conditions conducive to ALD.

13. The method according to claim 1, comprising positioning the plurality of substrates within the reaction space.

14. The method according to claim 13, wherein positioning the plurality of substrates within the reaction space comprises moving the plurality of substrates in a substantially vertical direction through an opening in a chamber box, which defines, at least in part, the reaction space.

15. The method according to claim 13, wherein positioning the plurality of substrates within the reaction space comprises moving the plurality of substrates in a substantially horizontal direction through an opening in a chamber box, which defines, at least in part, the reaction space.

16. The method according to claim 1 further comprising repeatedly and alternately forming a plasma in the reaction space.

17. The method according to claim 1, further comprising forming, at least in part, one of the vapor phase reactants from a plasma.

18. The method according to claim 1, wherein the first substrate and second substrate are serially aligned with respect to the gas flow.

19. A method for growing a thin film on a plurality of substrates in a reaction space according to the ALD method, the method comprising:
   repeatedly and alternately feeding vapor phase reactants into the reaction space in a form of vapor phase pulses to form a gas flow;
   directing the gas flow serially over the plurality of substrates that are separately removable from a reactor that defines the reaction space; and
   between at least two of the plurality of substrates, turning the gas flow approximately 150–210 degrees.

* * * * *